United States Patent
Wang et al.

(10) Patent No.: US 11,327,546 B2
(45) Date of Patent: May 10, 2022

(54) POWER CONTROL METHOD AND RELATED COMPUTER SYSTEM

(71) Applicant: Wiwynn Corporation, New Taipei (TW)

(72) Inventors: Kuang-Tsu Wang, New Taipei (TW); Kuo-Hua Tsai, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 396 days.

(21) Appl. No.: 16/358,683

(22) Filed: Mar. 19, 2019

(65) Prior Publication Data

US 2020/0201410 A1 Jun. 25, 2020

(30) Foreign Application Priority Data

Dec. 21, 2018 (TW) ................................ 10714643.6

(51) Int. Cl.
*G06F 1/3203* (2019.01)
*H05K 7/14* (2006.01)
*G06F 1/26* (2006.01)

(52) U.S. Cl.
CPC ............ *G06F 1/3203* (2013.01); *G06F 1/263* (2013.01); *H05K 7/1492* (2013.01)

(58) Field of Classification Search
CPC .............................. G06F 1/3203; G06F 1/263
See application file for complete search history.

(56) References Cited

U.S. PATENT DOCUMENTS

| | | | | |
|---|---|---|---|---|
| 5,121,500 A | * | 6/1992 | Arlington | G06F 9/4411 710/10 |
| 6,448,672 B1 | * | 9/2002 | Voegeli | H02J 1/102 307/52 |
| 2015/0095713 A1 | * | 4/2015 | Huang | G06F 1/266 714/43 |
| 2015/0289405 A1 | * | 10/2015 | Stewart | H05K 7/183 211/26 |

FOREIGN PATENT DOCUMENTS

| | | |
|---|---|---|
| CN | 101727430 A | 6/2010 |
| CN | 104516800 A | 4/2015 |
| CN | 107102612 A | 8/2017 |
| CN | 207067365 U | 3/2018 |

* cited by examiner

*Primary Examiner* — Kim Huynh
*Assistant Examiner* — Joshua Neveln
(74) *Attorney, Agent, or Firm* — Winston Hsu

(57) ABSTRACT

A power control method for controlling power paths between a baseboard and a server board includes: conducting a first power path between the baseboard and a detecting module of the server board via an isolated module; the baseboard obtaining a type of server card of the server board before the server board is powered on; and cutting off the first power path and conducting a second power path between a power source module of the server board and the detecting module of the server board via the isolated module after the server board is powered on; wherein the baseboard provides a side-band signal to the server board.

8 Claims, 4 Drawing Sheets

POWER CONTROL METHOD AND RELATED COMPUTER SYSTEM

BACKGROUND OF THE INVENTION

1. Field of the Invention

The present invention relates to a power control method and related computer system, and more particularly, to a power control method and related computer system that is capable of transferring power with a single signal.

2. Description of the Prior Art

In a conventional server system, a baseboard is unable to know a status of a server board before the server board is powered on. Before a server card (e.g. a server graphics card) is completely set up by the baseboard, the baseboard may provide power or randomly transmit false information to the server board without knowing a type of the server card. To solve the above problems, a conventional technique sets a detecting signal of the baseboard as a high voltage level and the power source for detecting the server board before it is powered on. When the server card is inserted into the baseboard, however, signal chattering may occur. This may cause a misjudgment or misdetection. Moreover, when the baseboard cannot take the high voltage detecting signal as the power source, an additional pin is needed. Therefore, an improved technique is required.

SUMMARY OF THE INVENTION

The present invention provides a power control method and related computer system to transfer power with a single signal, and control power paths between a baseboard and a server board, in order to improve the disadvantages of the conventional technique.

An embodiment of the present invention discloses a power control method for controlling power paths between a baseboard and a server board, comprising: conducting a first power path between the baseboard and a detecting module of the server board via an isolated module; the baseboard obtaining a type of server card of the server board before the server board is powered on; and cutting off the first power path and conducting a second power path between a power source module of the server board and the detecting module of the server board via the isolated module after the server board is powered on; wherein the baseboard provides a side-band signal to the server board.

Another embodiment of the present invention discloses a computer system, comprising: a baseboard, configured to provide a side-band signal; and a server board, coupled to the baseboard, comprising: a device; a detecting module, configured to detect a type of server card of the server board; an isolated module, configured to conduct a first power path between the baseboard and the detecting module before the server board is powered on, and cut off the first power path after the server board is powered on; and a power source module, configured to conduct a second power path of the power source module and the detecting module via the isolated module after the server board is powered on and provide power for the device and the detecting module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
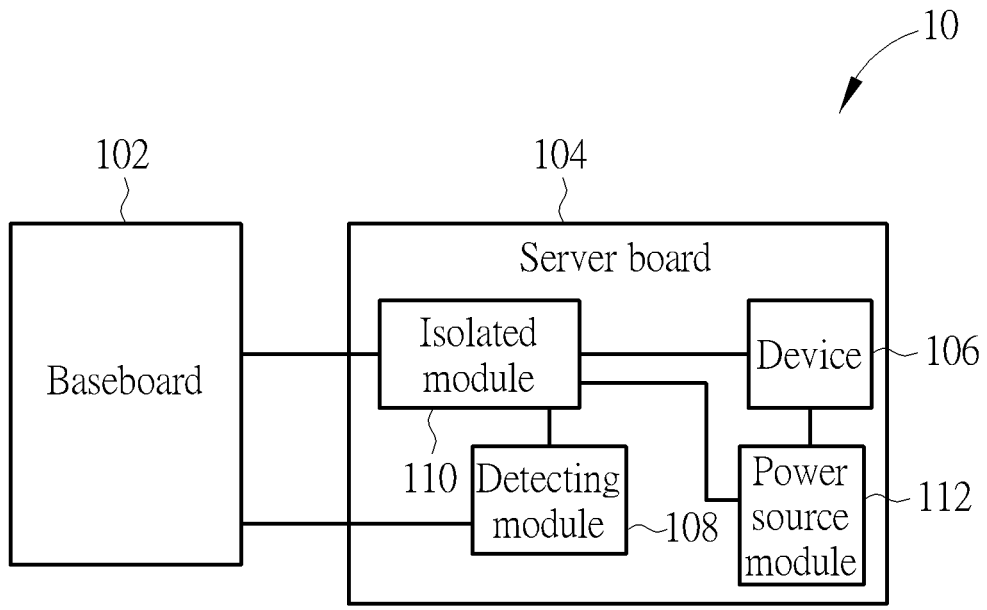
FIG. 1 is a schematic diagram of a computer system according to an embodiment of the present invention.
Figure 2:
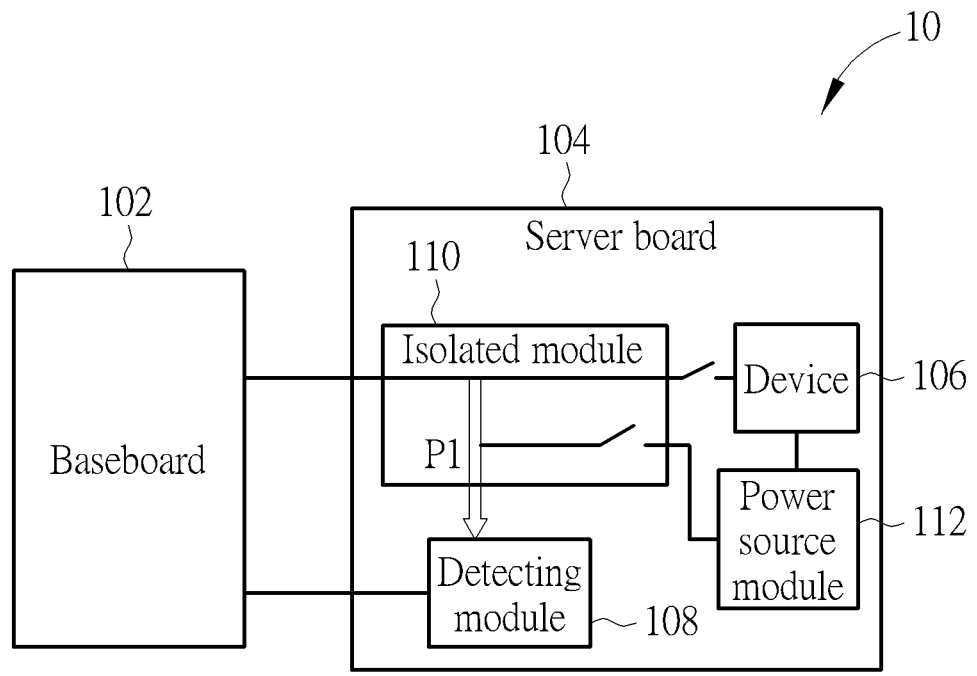
FIG. 2 is a schematic diagram of a first power path before a server board is powered on according to an embodiment of the present invention.
Figure 3:
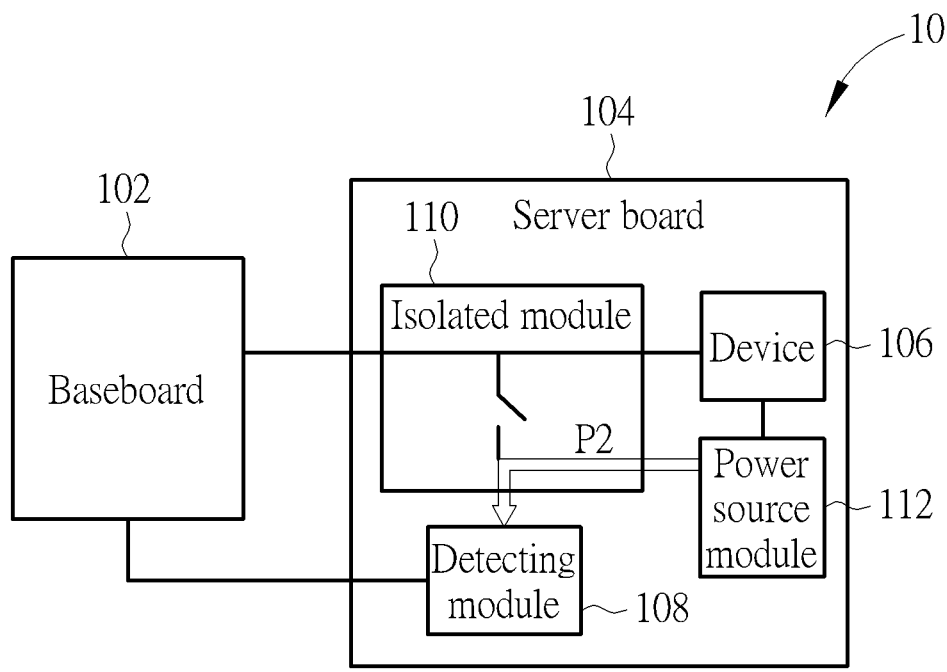
FIG. 3 is a schematic diagram of a second power path after the server board is powered on according to an embodiment of the present invention.

Refer to FIGS. 1, 2 and 3 together. FIG. 1 is a schematic diagram of a computer system 10 according to an embodiment of the present invention. The computer system 10 includes a baseboard 102 and a server board 104. The baseboard 102 may include a power source, a baseboard management controller (BMC) and at least a slot for a server card. In addition, the baseboard 102 may provide a side-band signal, e.g. a side-band signal smaller than 50 microamperes (µA), to the server board 104. The server board 104 is coupled to the baseboard 102, which includes a device 106, a detecting module 108, an isolated module 110 and a power source module 112. The detecting module 108 is configured to detect at least a type of server card of the server board 104. For example, when a server graphics card or a server accelerator card is inserted on the baseboard 102, the detecting module 108 may detect the type of the server card. The device 106 may be a System on a Chip (SoC) of the server board 104. The isolated module 110 is configured to conduct a first power path P1 between the baseboard 102 and the detecting module 108, disconnect a second power path P2 between the power source module 112 of the server board 104 and the detecting module 108 before the server board 104 is powered on, and cut off the first power path P1 and conduct the second power path P2 between the power source module 112 and the detecting module 108 of the server board 104 after the power source module 112 of the server board 104 is powered on. The power source module 112 is configured to provide power for the device 106 and the detecting module 108 after the server board 104 is powered on. In other words, before the server board 104 is powered on, the baseboard 102 may provide the side-band signal to the detecting module 108 as the power source via the isolated module 110, and detect the type of the server card of the server board 104 before the server board 104 is powered on. Therefore, the baseboard 102 of the computer system 10 of the present invention is not required to provide an extra power source to the server board 104 as the side-band signal of the baseboard 102 is utilized to provide the power before the server board 104 is powered on. In this way, the detecting module 108 may detect the type of the server card of the server board 104, and avoid a situation where the baseboard 102 is incorrectly detected after the power source module 112 of the server board 104 is turned on.

In detail, refer to FIG. 2, which is a schematic diagram of the first power path P1 before the server board 104 is powered on according to an embodiment of the present invention. Before the power of the server board 104 is turned on, i.e. before the device 106 of the server board 104 is powered on, the baseboard 102 provides the side-band signal to the detecting module 108 via the first power path P1, conducted by the isolated module 110, so as to confirm the type of the server card of the server board 104. Thereby, the baseboard 102 may individually perform an initiation setting for each server card according to the type of the server card of the server board 104, before the server board 104 is powered on. Utilizing the power provided by the side-band signal to the detecting module 108, the baseboard 102 may perform the initiation setting for each server card before the device 106 of the server board 104 is powered on, thereby avoiding a misdetection situation. In addition, before the server board 104 is powered on, the detecting module 108 may transmit a detecting signal with latch information to the baseboard 102.

Refer to FIG. 3, which is a schematic diagram of the second power path P2 after the server board 104 is powered on according to an embodiment of the present invention. As shown in FIG. 3, after the server board 104 is powered on, i.e. the power source module 112 is turned on, the isolated module 110 disconnects the first power path P1 and conducts the second power path P2 between the power source module 112 and the detecting module 108 of the server board 104. Therefore, the side-band signal of the baseboard 102 is normally connected to the device 106.

In brief, the computer system 10 according to the embodiments of the present invention is not required to provide the power source from the baseboard 102 to the server board 104 before the server board 104 is powered on. Instead, the present invention utilizes the side-band signal of the baseboard 102 as the power source for the detecting module 108 of the server board 104 to detect the type of the server card of the server board 104, to thereby avoid misdetection of the baseboard 102 after the power source module 112 of the server board 104 is turned on. Notably, those skilled in the art may properly design the computer system of the present invention according to different system requirements, and these also belong to the scope of the present invention.

Figure 4:
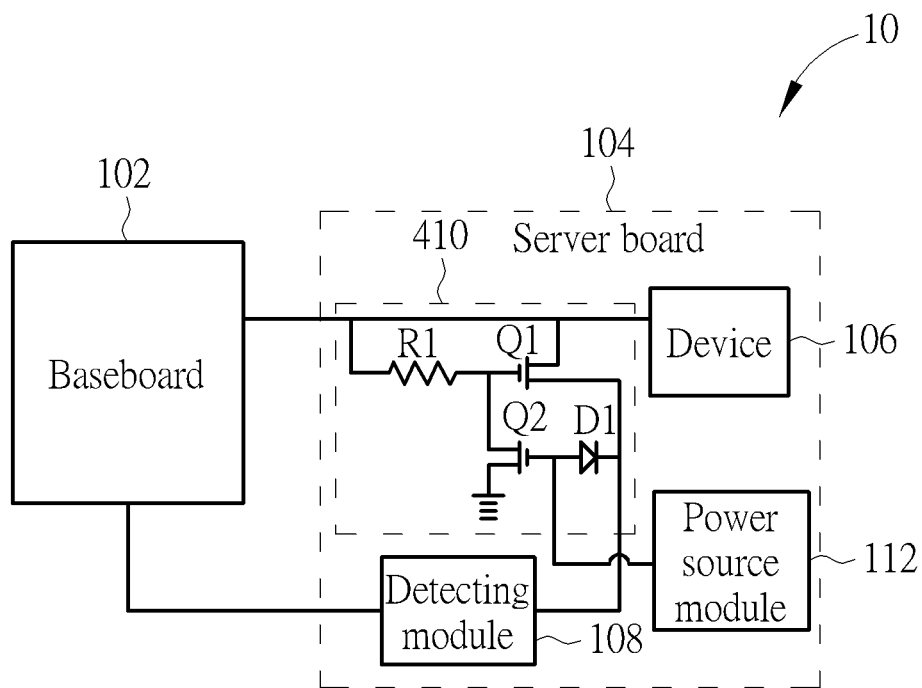
FIG. 4 is a circuit diagram of an isolated module applied to the computer system according to an embodiment of the present invention.

Based on different applications and design concepts, the computer system 10 of the present invention may be implemented by all kinds of methods. Refer to FIG. 4, which is a circuit diagram of an isolated module 410 applied to the computer system 10 according to an embodiment of the present invention. In an embodiment, the isolated module 410 consists of a resistor R1, transistors Q1, Q2 and a diode D1. As shown in FIG. 4, before the server board 104 is powered on, the transistor Q1 is conductive, while the transistor Q2 is not conductive. The power source of the detecting module 108 is provided by the baseboard 102, i.e. provided by the side-band signal, such that the detecting module 108 may detect the type of the server card of the server board 104, and transmit the type of the server card and the latch information to the baseboard management controller of the baseboard 102. After the power source module 112 of the server board 104 is powered on, the transistor Q1 is not conductive and the transistor Q2 is conductive. At the same time, the side-band signal of the baseboard 102 is normally connected to the device 106. The power source module 112 provides the power for the detecting module 108 via the diode D1 such that the detecting module 108 normally operates after the server board 104 is powered on.

Figure 5:
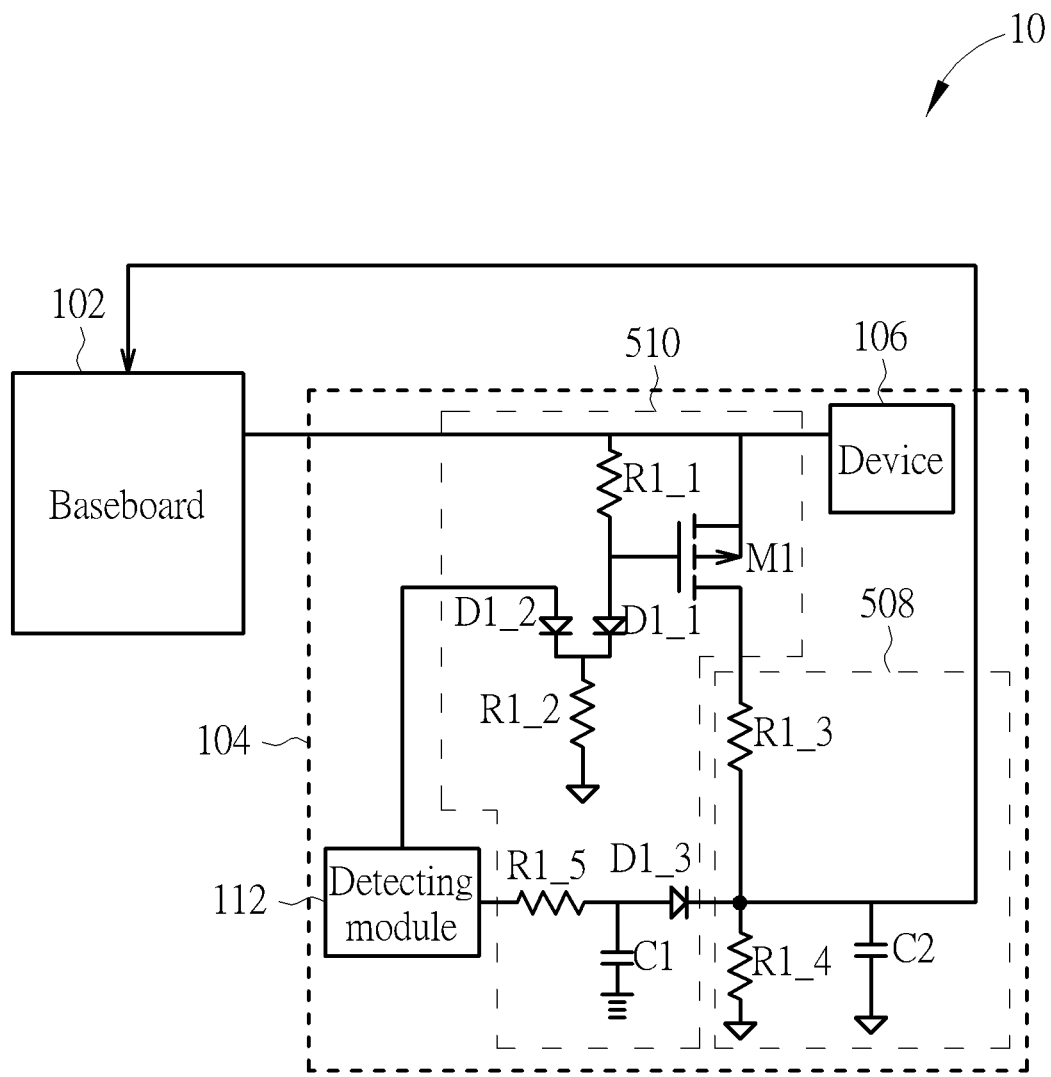
FIG. 5 is a circuit diagram of the isolated module and a detecting module applied to the computer system according to an embodiment of the present invention.

Refer to FIG. 5, which is a circuit diagram of an isolated module 510 and a detecting module 508 applied to the computer system 10 according to another embodiment of the present invention. The isolated module 510 includes resistors R1_1, R1_2, R1_5, a MOSFET M1, diodes D1_1, D1_2, D1_3 and a capacitor C1. The MOSFET M1 may be a p-channel Metal-Oxide-Semiconductor Field-Effect Transistor (MOSFET). The detecting module 508 includes resistors R1_3, R1_4 and a capacitor C2. As shown in FIG. 5, before the server board 104 is turned on, the MOSFET M1 is conductive. At the same time, the power source of the detecting module 508 is provided by the baseboard 102, i.e. provided by the side-band signal, such that the detecting module 508 may detect the type of the server card of the server board 104, and feedback the type of the server card and the latch information to the baseboard management controller of the baseboard 102. After the power source module 112 of the server board 104 is powered on, the MOSFET M1 is not conductive, and the power source module 112 provides the power for the detecting module 508 of the server board 104.

The embodiments above detail the circuit diagrams of the detecting module 108 and the isolated module 110. Notably, the side-band signal is smaller than 50 μA. Those skilled in the art may properly design the detecting module and the isolated module according to different system requirements using other circuits which may individually conduct the first power path P1 and the second power path P2. These modifications are also applicable to the present invention and not limited to the illustrated examples.

Figure 6:
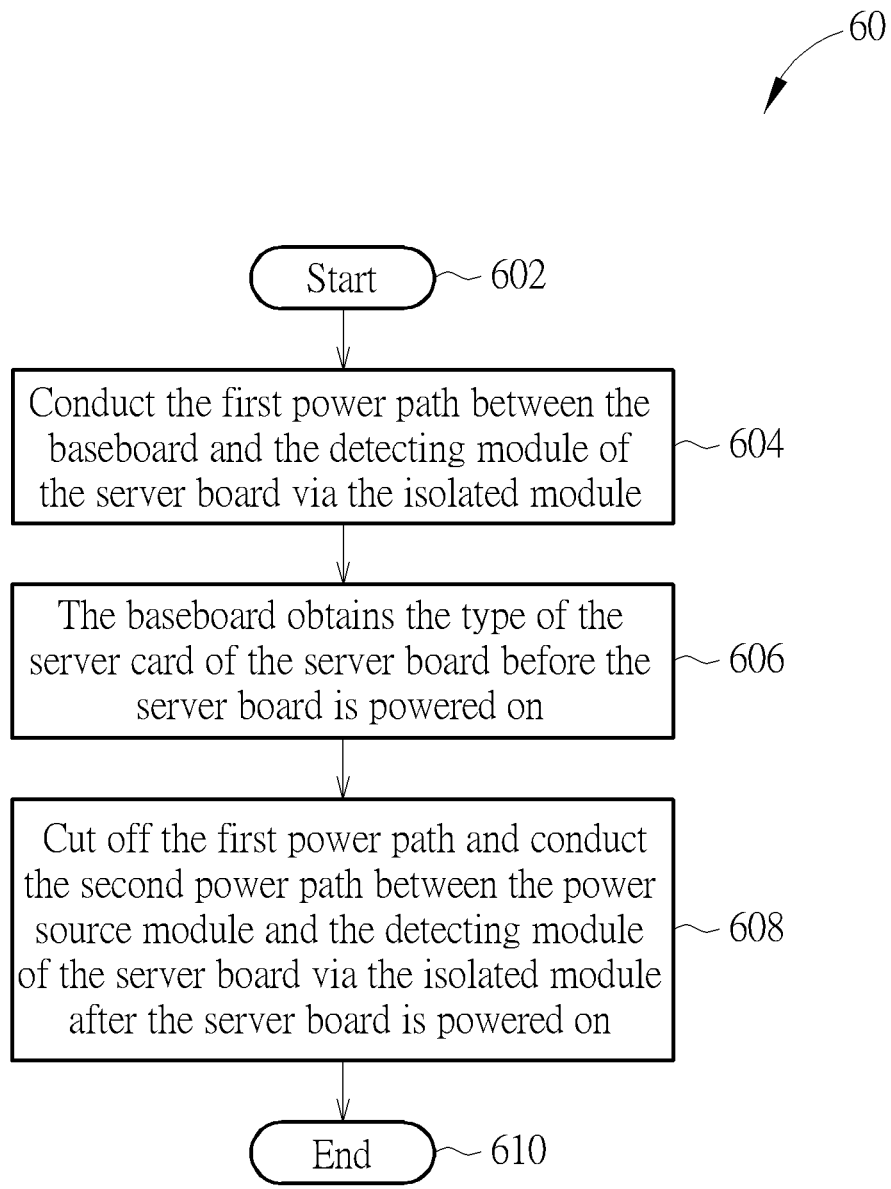
FIG. 6 is a schematic diagram of a control process according to an embodiment of the present invention.

An operation method of the computer system 10 may be illustrated by a control process 60, as shown in FIG. 6. The control process 60 includes the following steps:

Step 602: Start.

Step 604: Conduct the first power path P1 between the baseboard 102 and the detecting module 108 of the server board 104 via the isolated module 110.

Step 606: The baseboard 102 obtains the type of the server card of the server board 104 before the server board 104 is powered on.

Step 608: Cut off the first power path P1 and conduct the second power path P2 between the power source module 112 and the detecting module 108 of the server board 104 via the isolated module 110 after the server board 104 is powered on.

Step 610: End.

Further details regarding the operation of the control process 60 are provided by the embodiments of the computer system 10 above, and are not narrated here for brevity.

In summary, the present invention provides a power control method and related computer system to transfer power with a single signal, and control power paths between the baseboard and the server board without an additional power source provided by the baseboard to the server board, so as to avoid misdetection of the baseboard after the server board is powered on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power control method, for controlling power paths between a baseboard and a server board of a computer system, comprising:

conducting a first power path between the baseboard and a detecting module of the server board via an isolated module;

the baseboard obtaining a type of server card of the server board before the server board is powered on; and cutting off the first power path and conducting a second power path between a power source module of the server board and the detecting module of the server board via the isolated module after the server board is powered on by the power source module;

wherein the baseboard provides a side-band signal to the server board;

wherein the side-band signal is configured to provide power for the detecting module before the server board is powered on.

2. The power control method of claim 1, wherein the side-band signal is smaller than 50 microamperes (µA).

3. The power control method of claim 1, wherein the baseboard is configured to perform an initiation setting before the server board is powered on, according to the type of server card of the server board.

4. The power control method of claim 1, further comprising:

obtaining, by the baseboard, latch information before the server board is powered on.

5. A computer system, comprising:

a baseboard, configured to provide a side-band signal; and a server board, coupled to the baseboard, comprising:

a device;

a detecting module, configured to detect a type of server card of the server board;

an isolated module, configured to conduct a first power path between the baseboard and the detecting module before the server board is powered on, and cut off the first power path after the server board is powered on; and a power source module, configured to conduct a second power path of the power source module and the detecting module via the isolated module after the server board is powered on and provide power for the device and the detecting module;

wherein the side-band signal is configured to provide power for the detecting module before the server board is powered on.

6. The computer system of claim 5, wherein the side-band signal is smaller than 50 microamperes (µA).

7. The computer system of claim 5, wherein the baseboard is configured to perform an initiation setting before the server board is powered on, according to the type of server card of the server board.

8. The computer system of claim 5, wherein the baseboard obtains latch information before the server board is powered on.

* * * * *